(12) United States Patent
Xu et al.

(10) Patent No.: US 9,124,228 B2
(45) Date of Patent: Sep. 1, 2015

(54) AMPLIFIERS WITH BOOSTED OR DEBOOSTED SOURCE DEGENERATION INDUCTANCE

(71) Applicant: QUALCOMM Incorporated, San Diego, CA (US)

(72) Inventors: Rui Xu, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 112 days.

(21) Appl. No.: 13/857,031

(22) Filed: Apr. 4, 2013

(65) Prior Publication Data

US 2014/0300417 A1    Oct. 9, 2014

(51) Int. Cl.
*H03G 3/12* (2006.01)
*H03F 1/34* (2006.01)
*H03F 1/22* (2006.01)
(Continued)

(52) U.S. Cl.
CPC ............. *H03F 1/342* (2013.01); *H03F 1/223* (2013.01); *H03F 3/193* (2013.01); *H03F 3/245* (2013.01); *H03F 3/45179* (2013.01); *H03F 3/68* (2013.01); *H03F 3/72* (2013.01); *H03F 2200/111* (2013.01); *H03F 2200/121* (2013.01); *H03F 2200/156* (2013.01); *H03F 2200/159* (2013.01); *H03F 2200/492* (2013.01); *H03F 2200/541* (2013.01); *H03F 2203/45302* (2013.01); *H03F 2203/45318* (2013.01); *H03F 2203/45332* (2013.01); *H03F 2203/45386* (2013.01); *H03F 2203/45394* (2013.01); *H03F 2203/45511* (2013.01); *H03F 2203/45534* (2013.01); *H03F 2203/7209* (2013.01)

(58) Field of Classification Search
CPC ........................................................ H03G 3/12
USPC .......................... 330/283, 311, 253, 260, 261
See application file for complete search history.

(56) References Cited

U.S. PATENT DOCUMENTS 6,801,089 B2 * 10/2004 Costa et al. .................... 330/278
7,724,085 B2 *  5/2010 Manstretta ...................... 330/85
(Continued)

OTHER PUBLICATIONS

Feng L., et al., "Overlapped inductors and its application on a shared RF front-end in a MultiStandard IC", Custom Integrated Circuits Conference (CICC), 2011 IEEE, IEEE, Sep. 19, 2011, pp. 1-4, XP032063838, DOI: 1 0.11 09/CICC. 2011.6055390, ISBN: 978-1-4577-0222-8.

(Continued)

*Primary Examiner* — Henry Choe
(74) *Attorney, Agent, or Firm* — Smith Risley Tempel Santos LLC

(57) ABSTRACT

Amplifiers with boosted or deboosted source degeneration inductance are disclosed. In an exemplary design, an apparatus includes an amplifier circuit and a feedback circuit. The amplifier circuit receives an input signal and provides an output signal and includes a source degeneration inductor. The feedback circuit is coupled between a node of the amplifier circuit and the source degeneration inductor. The feedback circuit provides feedback to vary an input impedance of an amplifier including the amplifier circuit and the feedback circuit. The feedback circuit may be programmable and may be enabled to provide feedback or disabled to provide no feedback. Alternatively, the feedback circuit may always be enabled to provide feedback. In either case, the feedback circuit may have a variable gain to provide a variable input impedance for the amplifier.

17 Claims, 8 Drawing Sheets

(51) Int. Cl.
*H03F 3/193* (2006.01)
*H03F 3/24* (2006.01)
*H03F 3/45* (2006.01)
*H03F 3/68* (2006.01)
*H03F 3/72* (2006.01)

(56) References Cited

U.S. PATENT DOCUMENTS

| | | | |
|---|---|---|---|
| 7,902,925 B2* | 3/2011 | Kim et al. | 330/311 |
| 7,936,220 B2 | 5/2011 | Li et al. | |
| 8,031,005 B2* | 10/2011 | Xiong et al. | 330/311 |
| 8,203,388 B2* | 6/2012 | Kathiresan et al. | 330/311 |
| 8,319,555 B1* | 11/2012 | Heikkinen et al. | 330/283 |
| 2003/0234685 A1* | 12/2003 | Ranmuthu | 330/86 |
| 2008/0231369 A1 | 9/2008 | Kim et al. | |
| 2012/0293265 A1 | 11/2012 | Heikkinen et al. | |
| 2013/0135054 A1* | 5/2013 | Ito et al. | 330/308 |

OTHER PUBLICATIONS

International Search Report and Written Opinion—PCT/US2014/032479—ISA/EPO—Jul. 15, 2014.

Kim T.S., et al., "Linearization of differential CMOS low noise amplifier using cross-coupled post distortion canceller" Radio Frequency Integrated Circuits Symposium, 2008. RFIC 2008. IEEE, IEEE, Piscataway, NJ, USA, Jun. 17, 2008, pp. 83-86, XP031284290 ISBN: 978-1-4244-1808-4 Section II; figures 1,3.

Wilson J., et al., "Input match and load tank digital calibration of an inductively degenerated CMOS LNA," Integration the VLSI Journal, North-Holland Publishing company, Amsterdam, NL, vol. 42 (1), Jan. 1, 2009, pp. 3-9, XP025684649, ISSN: 0167-9260, DOI: 10.1016/J.VLSI.2007.12.003 [retrieved on Jan. 19, 2008], p. 3, left-hand column, line 2—p. 9, left-hand column, line 11; figures 6,10.

* cited by examiner

AMPLIFIERS WITH BOOSTED OR DEBOOSTED SOURCE DEGENERATION INDUCTANCE

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a local oscillator (LO) signal with data to obtain a modulated signal, amplify the modulated signal to obtain an output radio frequency (RF) signal having the proper transmit power level, and transmit the output RF signal via an antenna to a base station. For data reception, the receiver may obtain a received RF signal via the antenna and may amplify and process the received RF signal to recover data sent by the base station.

A wireless device may include amplifiers of different types for different purposes. For example, a wireless device may include a low noise amplifier (LNA) in a receiver, a power amplifier (PA) in a transmitter, and a variable gain amplifier (VGA) in the receiver and/or transmitter. An amplifier may need to meet various requirements related to gain, input matching, etc.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers with boosted or deboosted source degeneration inductance are disclosed herein. Such an amplifier includes a source degeneration inductor and uses feedback to effectively boost/increase or deboost/decrease the inductance of the source degeneration inductor. The boosted or deboosted source degeneration inductance may improve performance (e.g., improve input matching) and provide other advantages. Amplifiers with boosted or deboosted source degeneration inductance may be used for various electronic devices such as wireless communication devices.

Figure 1:
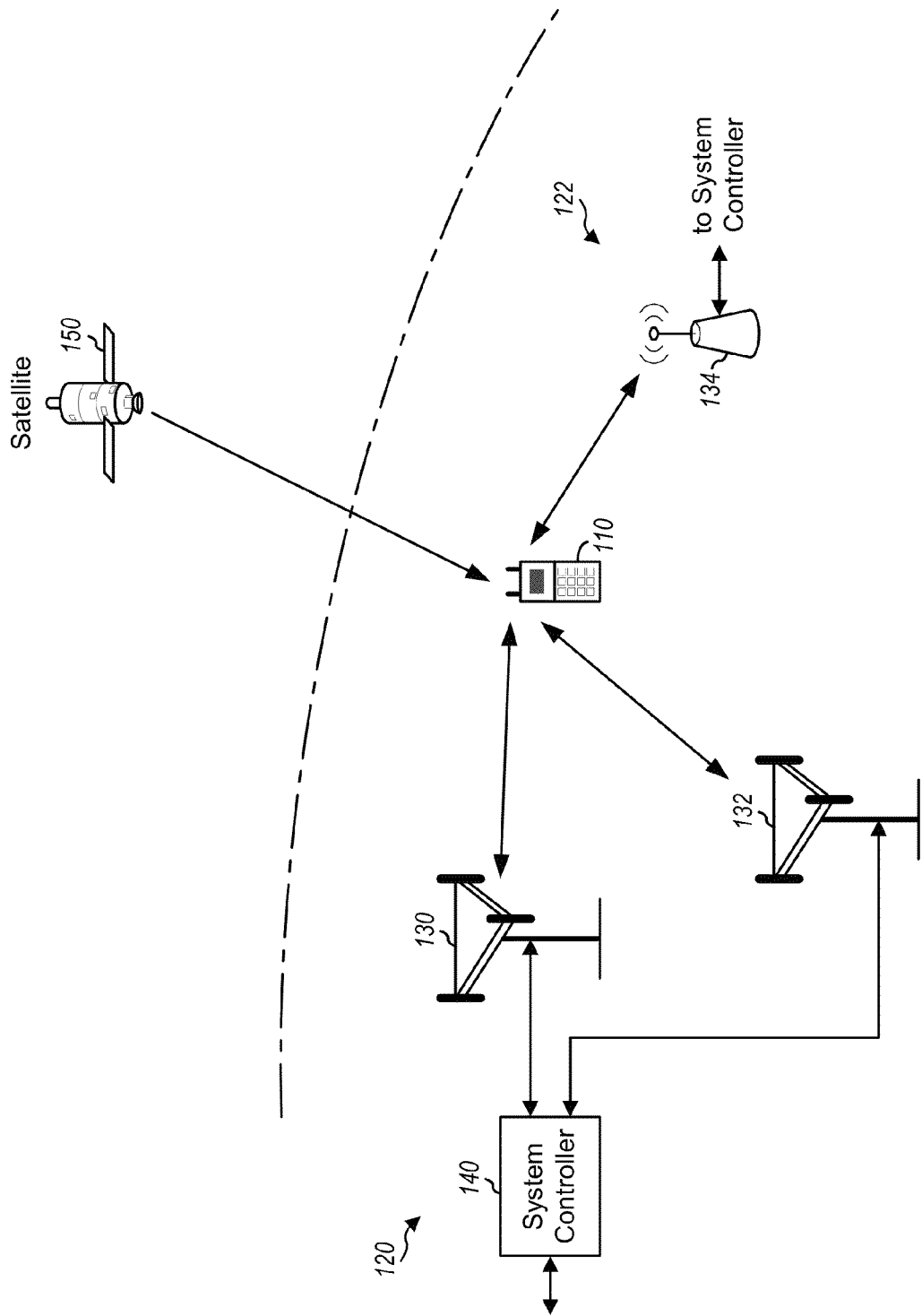
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Figure 2:
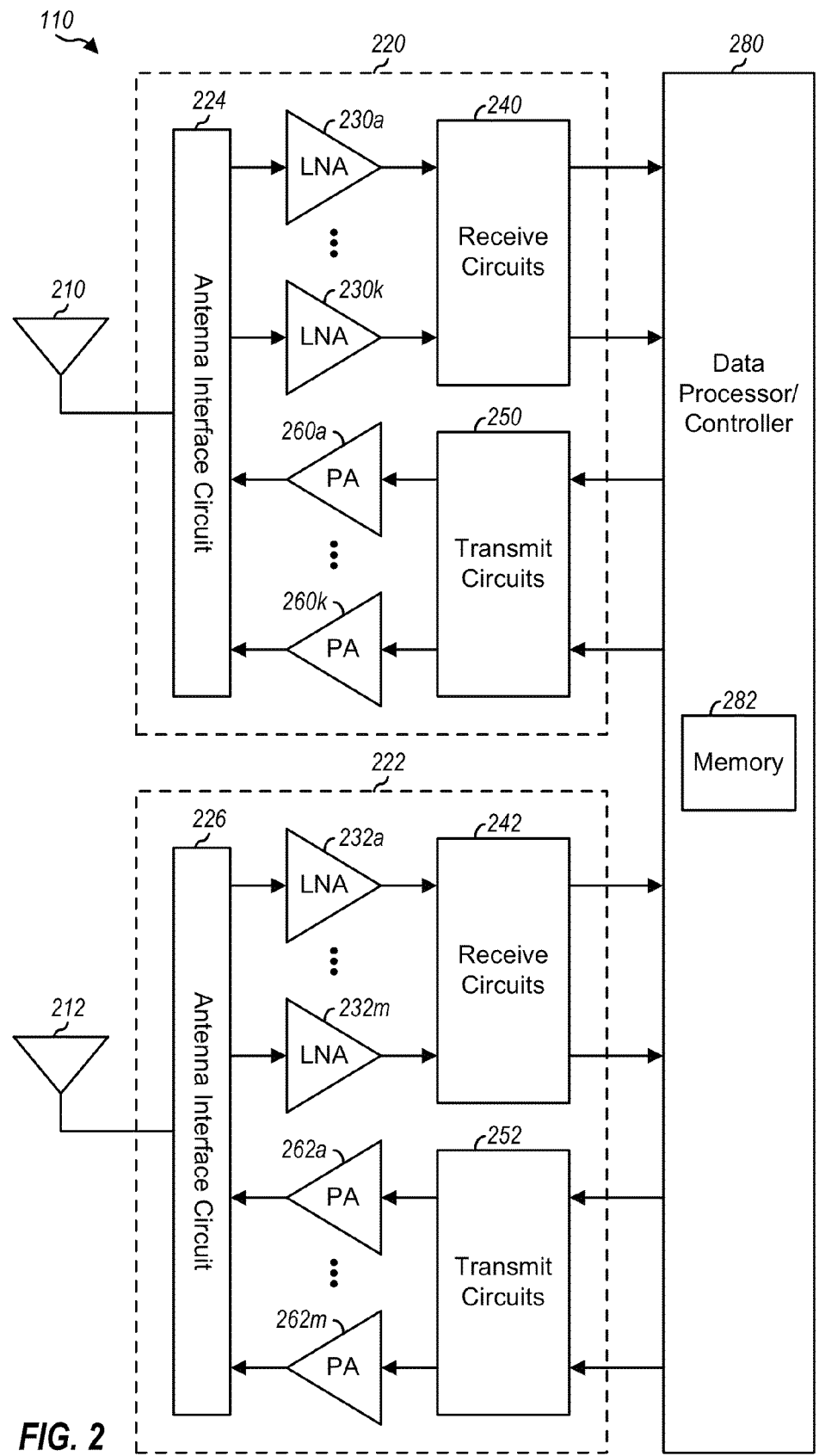
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes an antenna interface circuit 224, multiple (K) LNAs 230a to 230k, receive circuits 240, transmit circuits 250, and multiple (K) power amplifiers (PAs) 260a to 260k. Transceiver 222 includes an antenna interface circuit 226, multiple (M) LNAs 232a to 232m, receive circuits 242, transmit circuits 252, and multiple (M) PAs 262a to 262m. Transceivers 220 and 222 may support multiple frequency bands, carrier aggregation, multiple radio technologies, multiple wireless systems, receive diversity, transmit diversity, MIMO transmission from multiple transmit antennas to multiple receive antennas, etc., or any combination thereof.

For data reception, antenna 210 receives signals from base stations and/or other transmitter stations and provides a received RF signal to antenna interface circuit 224. Antenna interface circuit 224 provides one or more input RF signals to one or more selected LNAs 230. Antenna interface circuit 224 may include switches, duplexers, diplexers, transmit filters, receive filters, matching circuits, directional couplers, etc. Each selected LNA 230 amplifies its input RF signal and provides one or more amplified RF signals to receive circuits 240. Receive circuits 240 downconvert each amplified RF signal from RF to baseband, filter and amplify the downconverted signal, and provide an input baseband signal to data processor 280. Receive circuits 240 may include mixers, filters, amplifiers, matching circuits, oscillators, LO generators, phase locked loops (PLLs), etc.

For data transmission, data processor 280 processes (e.g., encodes and modulates) data to be transmitted and provides one or more output baseband signals to transmit circuits 250. Transmit circuits 250 amplify, filter, and upconvert each output baseband signal from baseband to RF and provide a resultant modulated signal to a selected PA 260. Transmit circuits 250 may include amplifiers, filters, mixers, matching circuits, oscillators, LO generators, PLLs, etc. Each selected PA 260 amplifies its modulated signal and provides an output RF signal having the proper transmit power level. The output RF signal from each selected PA 260 is routed through antenna interface circuit 224 and transmitted via antenna 210.

LNAs 232, receive circuits 242, transmit circuits 252, and PAs 262 within transceiver 222 may operate in similar manner as LNAs 230, receive circuits 240, transmit circuits 250, and PAs 260 within transceiver 220. Transceivers 220 and 222 may include other circuits not shown in FIG. 2. All or a portion of transceivers 220 and 222 may be implemented on one or more analog integrated circuits (ICs), RF ICs (RFICs), mixed-signal ICs, etc. For example, LNAs 230 and receive circuits 240 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receiver circuits 240 and 242 and data being transmitted via transmit circuits 250 and 252. Controller 280 may control the operation of various circuits within transceivers 220 and 222. A memory 282 may store program codes and data for data processor/controller 280. Data processor/controller 280 may be implemented on one or more application specific integrated circuits (ASICs) and/or other ICs.

FIG. 2 shows an exemplary design of wireless device 110 with two transceivers 220 and 222 coupled to two antennas 210 and 212. In general, a wireless device may include any number of transceivers for any number of antennas. Each transceiver may include any number of LNAs and any number of PAs to support any number of frequency bands, any number of wireless systems, any number of radio technologies, etc.

LNAs 230 and 232 may be implemented in various manners and with transistors of various types. Some exemplary circuit designs of LNAs implemented with N-channel metal oxide semiconductor (NMOS) transistors and P-channel metal oxide semiconductor (PMOS) transistors are described below.

Figure 3:
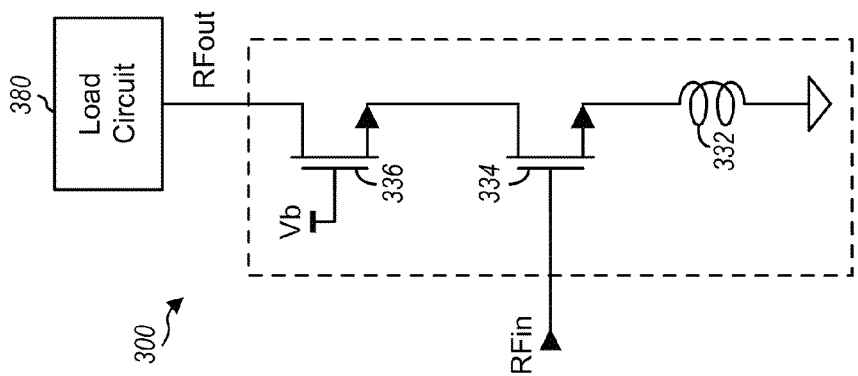
FIG. 3 shows an LNA with fixed source degeneration inductance.

FIG. 3 shows a schematic diagram of an LNA 300 with fixed source degeneration inductance. LNA 300 includes a source degeneration inductor 332, a gain transistor 334, and a cascode transistor 336. Gain transistor 334 has its source coupled to one end of inductor 332, its gate receiving an input RF signal (RFin), and its drain coupled to the source of cascode transistor 336. The other end of inductor 332 is coupled to circuit ground. Cascode transistor 336 has its gate receiving a control signal (Vb) and its drain coupled to a load circuit 380. Gain transistor 334 and cascode transistor 336 may be implemented with NMOS transistors, as shown in FIG. 3, or with transistors of other types.

Within LNA 300, gain transistor 334 amplifies the RFin signal and provides an amplified signal. Cascode transistor 336 buffers the amplified signal and provides an output RF signal (RFout) to load circuit 380. Source degeneration inductor 332 performs several functions. First, inductor 332 enables LNA 300 to obtain good dynamic range (e.g., low noise figure) and achieve high sensitivity for a receiver with low power consumption. Second, inductor 332 helps with input matching of LNA 300.

An LNA may include a fixed source degeneration inductor having an inductance selected to obtain the desired performance, e.g., the desired dynamic range, linearity, and input matching. The LNA may have a configurable gain and/or other configurable characteristics. A fixed source degeneration inductor may be unable to provide good performance for different possible settings of the LNA.

In an aspect of the present disclosure, an amplifier includes a source degeneration inductor and uses feedback to either boost/increase or deboost/decrease the inductance of the source degeneration inductor. The boosted or deboosted source degeneration inductance may improve performance of the amplifier under different operating conditions.

Figure 4:
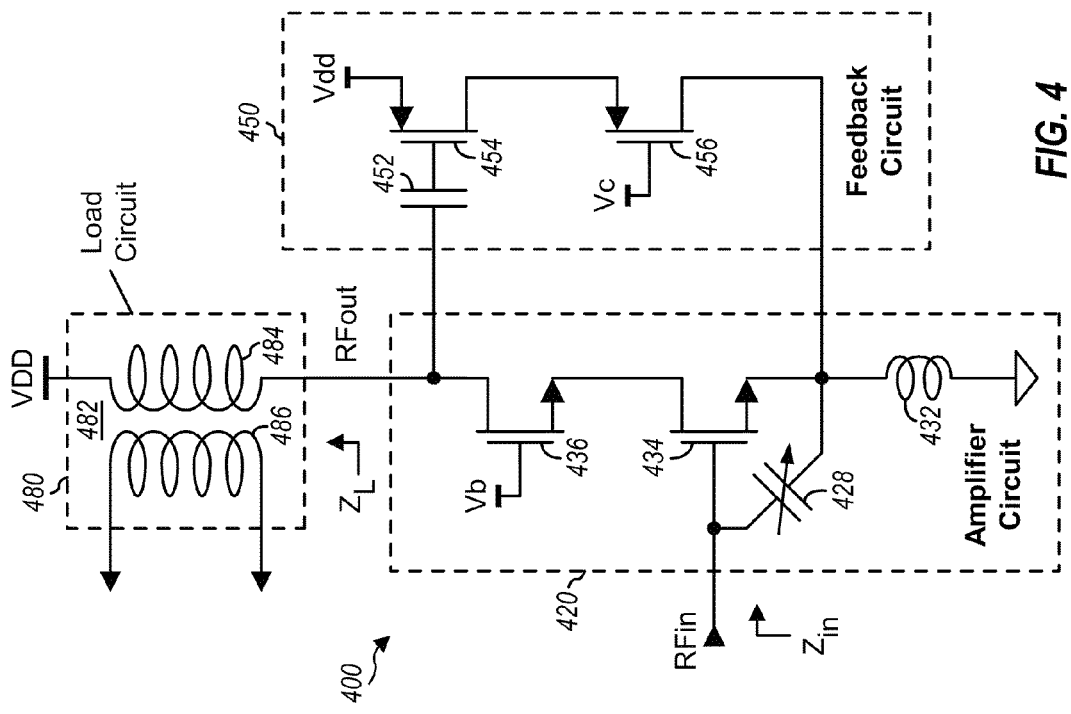
FIG. 4 shows an LNA with boosted source degeneration inductance.

FIG. 4 shows a schematic diagram of an exemplary design of an LNA 400 with boosted source degeneration inductance. LNA 400 may be used for any of LNAs 230 and 232 in FIG. 2. LNA 400 includes an amplifier circuit 420 and a feedback circuit 450.

In the exemplary design shown in FIG. 4, amplifier circuit 420 includes a source degeneration inductor 332, a gain transistor 434, a cascode transistor 436, and an adjustable capacitor 428. Gain transistor 434 has its source coupled to one end of inductor 432, its gate receiving an input RF signal (RFin), and its drain coupled to the source of cascode transistor 436. The other end of inductor 432 is coupled to circuit ground. Cascode transistor 436 has its gate receiving a first control signal (Vb) and its drain coupled to a load circuit 480. Capacitor 428 is coupled between the gate and source of gain transistor 434. Gain transistor 434 may be referred to as a main gain transistor, and cascode transistor 436 may be referred to as a main cascode transistor. Gain transistor 434 and cascode transistor 436 may be implemented with NMOS transistors, as shown in FIG. 4, or with transistors of other types.

In the exemplary design shown in FIG. 4, feedback circuit 450 includes an AC coupling capacitor 452, a gain transistor 454, and a cascode transistor 456. Capacitor 452 has one end coupled to the drain of cascode transistor 436 and the other end coupled to the gate of gain transistor 454. Gain transistor 454 has its source coupled to a power supply voltage (Vdd) and its drain coupled to the source of cascode transistor 456. Cascode transistor 456 has its gate receiving a second control signal (Vc) and its drain coupled to source degeneration inductor 432. Gain transistor 454 may be referred to as a feedback gain transistor, and cascode transistor 456 may be referred to as a feedback cascode transistor. Gain transistor 454 and cascode transistor 456 may be implemented with PMOS transistors, as shown in FIG. 4, or with transistors of other types.

In the exemplary design shown in FIG. 4, load circuit 480 includes a transformer 482 comprising a primary coil 484 and a secondary coil 486. Primary coil 484 is coupled between the drain of cascode transistor 436 and the Vdd supply voltage. Secondary coil 486 provides a differential output RF signal to a downconverter (not shown in FIG. 4).

Within LNA 400, main gain transistor 434 amplifies the RFin signal and provides an amplified signal. Main cascode transistor 436 buffers the amplified signal and provides the RFout signal to load circuit 480. Source degeneration inductor 432 enables LNA 400 to obtain good dynamic range, low noise figure, high sensitivity, and good input matching for LNA 400. Feedback gain transistor 454 amplifies the RFout signal from cascode transistor 436 and provides a second amplified signal. Feedback cascode transistor 456 buffers the second amplified signal and drives source degeneration inductor 432.

In an exemplary design shown in FIG. 4, feedback circuit 450 provides negative feedback from the output of amplifier circuit 420 to source degeneration inductor 432. Negative feedback may result in a boost/increase of the source degeneration inductance. In another exemplary design, a feedback circuit may provide positive feedback, which may result in a deboost/decrease of the source degeneration inductance.

In an exemplary design, amplifier circuit 420 may have a fixed gain, which may be determined by various factors such as the size of gain transistor 434, the amount of bias current for gain transistor 434, etc. In another exemplary design, amplifier circuit 420 may have a variable gain, which may be adjusted by varying the amount of bias current for gain transistor 434.

FIG. 4 shows an exemplary design of LNA 400 with boosted source degeneration inductance. An LNA with boosted or deboosted source degeneration inductance may also be implemented in other manners. In another exemplary design, an LNA may include (i) at least one gain transistor coupled to at least one source degeneration inductor and (ii) at least one additional gain transistor coupled directly to circuit ground. The gain transistor(s) or the additional gain transistor(s) may be selected, e.g., depending on signal conditions. In another exemplary design, an LNA may include a feedback circuit coupled between an output and an input of the LNA (instead between the output of the LNA and a source degeneration inductor). The feedback circuit may comprise a resistor, a capacitor, a transistor, some other circuit component, or a combination thereof. The feedback circuit may help with input matching and may also improve linearity of the LNA.

In another exemplary design, an LNA may include a cascode circuit in place of a cascode transistor. The cascode circuit may include (i) a first cascode transistor coupled between the drain of a gain transistor and an intermediate node, (ii) a second cascode transistor coupled between the intermediate node and an output of the LNA, and (iii) a shunt transistor coupled between the intermediate node and circuit ground. When the cascode circuit is enabled, the first and second cascode transistors may be turned ON to provide an output RF signal at the LNA output, and the shunt transistor may be turned OFF. When the cascode circuit is disabled, the first and second cascode transistors may be turned OFF to provide no output RF signal at the LNA output, and the shunt transistor may be turned ON to pull the intermediate node to circuit ground and provide better isolation between the LNA output and the gain transistor. Better isolation may be desirable when the same load circuit is shared by multiple gain transistors, e.g., in different LNAs.

In another exemplary design, an LNA may include multiple amplifier circuits coupled in parallel. One amplifier circuit may include a gain transistor, a cascode transistor, and a source degeneration inductor, e.g., similar to amplifier circuit 420 in FIG. 4. Each remaining amplifier circuit may include a gain transistor coupled to a cascode transistor in similar manner as gain transistor 434 and cascode transistor 436. The gain transistors in the multiple amplifier circuits may have their gates coupled together and their sources coupled together and to the source degeneration inductor. The cascode transistors in the multiple amplifier circuits may have their drains coupled together and their gates receiving separate control signals. The LNA may be considered as being split into multiple LNA sections, with each amplifier circuit corresponding to a different LNA section. One or more amplifier circuits may be enabled to generate an RFout signal. More amplifier circuits may be enabled to provide higher gain for the LNA. The bias current of each enabled amplifier circuit may also be varied to adjust the gain of the LNA.

FIG. 4 shows an exemplary design of a feedback circuit comprising a PMOS gain transistor and a PMOS cascode transistor coupled between an output of an LNA and a source degeneration inductor. In another exemplary design, a feedback circuit may include only a PMOS gain transistor coupled (i) between the drain of an NMOS cascode transistor (e.g., cascode transistor 436) and a source degeneration inductor or (ii) between the drain of an NMOS gain transistor (e.g., gain transistor 434) and the source degeneration inductor. In yet another exemplary design, an amplifier circuit may include multiple cascode transistors coupled in a stack, and a feedback circuit may also include multiple cascode transistors coupled in a stack. The stacks of cascode transistors may enable an amplifier to handle a large voltage swing.

In the exemplary design shown in FIG. 4, feedback circuit 450 implements a common-source amplifier having (i) the RFout signal applied to the gate of PMOS gain transistor 454 and (ii) the source of PMOS gain transistor 454 coupled to AC ground. In another exemplary design, a feedback circuit may implement a common-gate amplifier having (i) the RFout signal applied to the source of PMOS gain transistor 454 and (ii) the gate of PMOS gain transistor 454 coupled to AC ground.

In an exemplary design, source degeneration inductor 432 may have a fixed inductance. In another exemplary design, inductor 432 may be a configurable inductor having a variable or programmable inductance. For example, inductor 432 may be implemented with multiple inductors coupled in series and/or multiple inductors coupled in parallel. Different inductance values may be obtained by (i) shorting one or more series-coupled inductors via one or more switches and/or (ii) disconnecting one or more parallel-coupled inductors via one or more switches.

Load circuit 480 may be implemented in other manners. In another exemplary design, a load circuit may include an inductor and possibly a capacitor coupled between the Vdd supply and the drain of cascode transistor 436. In yet another exemplary design, a load circuit may include a PMOS transistor having its source coupled to the Vdd supply and its drain coupled to the drain of cascode transistor 436. The PMOS transistor may provide an active load for cascode transistor 436.

Figure 5:
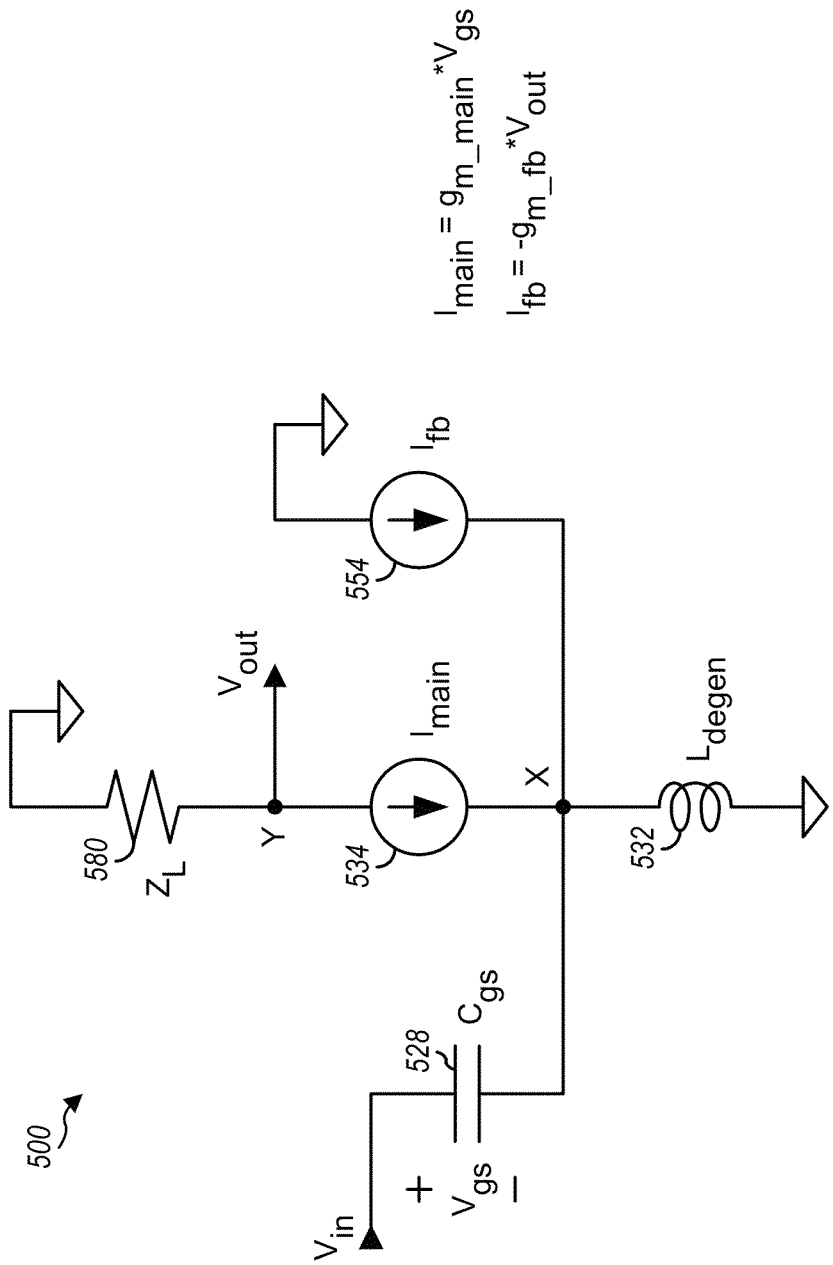
FIG. 5 shows a small-signal model of the LNA in FIG. 4.

FIG. 5 shows a schematic diagram of an amplifier 500, which is a small-signal model of LNA 400 in FIG. 4. Within amplifier 500, a capacitor 528 is coupled between an input of amplifier 500 and node X. An inductor 532 is coupled between node X and circuit ground. A current source 534 is coupled between node X and node Y. A current source 554 is coupled between node X and circuit ground. A resistor 580 is coupled between node Y and circuit ground.

Within amplifier 500, node X corresponds to the source of main gain transistor 434 within LNA 400 in FIG. 4. Node Y corresponds to the drain of main cascode transistor 436 within LNA 400. Capacitor 528 models capacitor 428 as well as the gate-to-source capacitance of main gain transistor 434. Capacitor 528 has a capacitance of $C_{gs}$ and a voltage of $V_{gs}$ across its two terminals. Inductor 532 models inductor 432 in LNA 400 and has an inductance of $L_{degen}$. Current source 534 models main gain transistor 434 and provides a current of $g_{m\_main} \cdot V_{gs}$, where $g_{m\_main}$ is a small signal gain of main gain transistor 434, and $V_{gs}$ is a gate-to-source voltage of main gain transistor 434. Current source 554 models feedback gain transistor 454 and provides a current of $g_{m\_fb} \cdot V_{out}$, where $g_{m\_fb}$ is a small signal gain of feedback gain transistor 454, and $V_{out}$ is an output voltage at the drain of main cascode transistor 436. Resistor 580 models load circuit 480 and has an impedance of $Z_L$.

LNA 400 has a voltage gain of G and an input impedance of $Z_{in}$, which may be expressed as:

$$G = \frac{V_{out}}{V_{in}} = \frac{V_{out}}{\sqrt{P_{in}/Z_S}} = \frac{Z_S^{1/2} \cdot g_{m\_main} \cdot Z_L}{j\omega \cdot C_{gs} \cdot Z_{in}^{3/2}}, \text{ and} \quad \text{Eq (1)}$$

$$Z_{in} = j\omega \cdot L_{degen} + \frac{1}{j\omega \cdot C_{gs}} + (1 + g_{m\_fb} \cdot Z_L) \cdot \frac{g_{m\_main}}{C_{gs}} \cdot L_{degen}, \quad \text{Eq (2)}$$

where $L_{degen}$ is an inductance of inductor 432,
$C_{gs}$ is a gate-to-source capacitance of main gain transistor 434,
$g_{m\_main}$ is a small signal gain of main gain transistor 434,
$g_{m\_fb}$ is a small signal gain of feedback gain transistor 454,
$Z_L$ is an impedance of load circuit 480,
$Z_S$ is an output impedance of a source providing the input signal,
$Z_{in}$ is an input impedance of LNA 400,
$V_{in}$ is an input signal at the gate of main gain transistor 434,
$P_{in}$ is a power of the input signal,
$V_{out}$ is an output signal at the drain of main cascode transistor 436, and
G is a voltage gain of LNA 400.

$Z_S$ may be 50 Ohms or some other value. $C_{gs}$ may include the capacitance of capacitor 428 as well as parasitic capacitance between the gate and source of main gain transistor 434. $C_{gs}$ may be adjustable by varying the capacitance of adjustable capacitor 428.

As shown in equation (1), the gain of LNA 400 may be dependent on various factors such as the gain $g_{m\_main}$ of main gain transistor 434, the $C_{gs}$ capacitance, the input impedance $Z_{in}$ of LNA 400, etc. The $C_{gs}$ capacitance may be adjusted to obtain good input matching for LNA 400. The gain of LNA 400 may be varied by adjusting the bias current of main gain transistor 434, adjusting the transistor size of main gain transistor 434, etc.

In an exemplary design, LNA 400 may have a fixed gain. For example, the $C_{gs}$ capacitance may be adjusted to obtain good input matching for LNA 400. The bias current of main gain transistor 434 may then be adjusted to obtain a desired $g_{m\_main}$ gain that can account for changes to the $C_{gs}$ capacitance and maintain an approximately fixed gain for LNA 400. In another exemplary design, LNA 400 may have a variable gain. For example, the bias current of main gain transistor 434 may be adjusted to obtain the desired gain for LNA 400.

As shown in equation (2), the input impedance $Z_{in}$ of LNA 400 includes (i) a real part composed of the term $$(1 + g_{m\_fb} \cdot Z_L) \cdot \frac{g_{m\_main}}{C_{gs}} \cdot L_{degen}$$

and (ii) an imaginary part composed of the term $$j\omega \cdot L_{degen} + \frac{1}{j\omega \cdot C_{gs}}.$$

The real part of $Z_{in}$ may be dependent on both the gain $g_{m\_main}$ of main gain transistor 434 and the gain $g_{m\_fb}$ of feedback gain transistor 454. The real part of $Z_{in}$ may be adjusted by varying the gain $g_{m\_fb}$ of feedback gain transistor 454, e.g., by varying the bias current and/or the transistor size of feedback gain transistor 454. The bias current of feedback gain transistor 454 may be varied by adjusting a bias voltage applied to the gate of gain transistor 454. The real part of $Z_{in}$ may be changed (e.g., boosted) by the factor of $(1+g_{m\_fb} \cdot Z_L)$. Since the load impedance $Z_L$ may be relatively large (e.g., on order of hundreds of ohms), even a small $g_{m\_fb}$ may provide an effective change of the real part of $Z_{in}$. The imaginary part of $Z_{in}$ may be adjusted by varying $C_{gs}$ through adjustable capacitor 428.

The higher $Z_{in}$ with boosting of source degeneration inductance may degenerate the input, reduce gain, and improve linearity of LNA 400. Furthermore, the noise figure of LNA 400 may be negligibly impacted since the gain $g_{m\_fb}$ of the feedback path may be relatively small.

Boosting or deboosting of source degeneration inductance may be applied in various manners. In an exemplary design, feedback may always be applied in order to always obtain a boost or deboost of source degeneration inductance. In another exemplary design, feedback may be selectively applied in order to obtain a programmable boost or deboost of the source degeneration inductance, e.g., when necessary or desired. For both exemplary designs, the amount of boost or deboost may be varied, e.g., by adjusting the bias voltage at the gate of the feedback gain transistor and/or the transistor size.

Wireless device 110 may be able to operate in low-band covering frequencies lower than 1000 megahertz (MHz), mid-band covering frequencies from 1000 MHz to 2300 MHz, and/or high-band covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as TD-SCDMA and GSM systems, or LTE and GSM systems, or CDMA and GSM systems, etc. Wireless device 110 may include one or more SIMO LNAs and/or one or more MIMO LNAs to support carrier aggregation, CoMP, concurrently services from multiple wireless systems, etc.

Figure 6A:
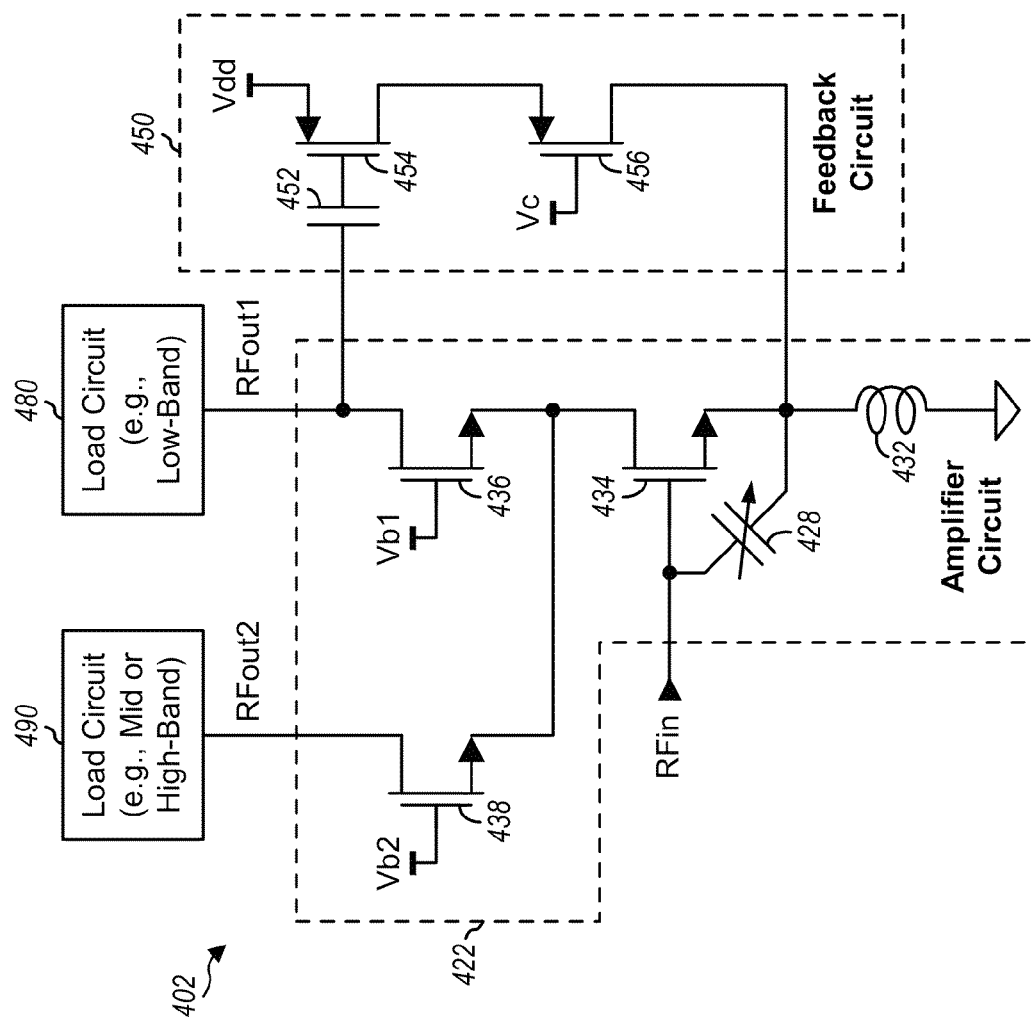
FIGS. 6A and 6B show two exemplary designs of a single-input multiple-output (SIMO) LNA with boosted source degeneration inductance.

FIG. 6A shows a schematic diagram of an exemplary design of a SIMO LNA 402 with boosted source degeneration inductance. LNA 402 may be used for any of LNAs 230 and 232 in FIG. 2. LNA 402 includes one LNA input receiving one input RF signal (RFin) and two LNA outputs providing up to two output RF signals (RFout1 and RFout2), which may be for two band groups. LNA 402 includes an amplifier circuit 422 and feedback circuit 450.

In the exemplary design shown in FIG. 6A, amplifier circuit 422 includes gain transistor 434, cascode transistor 436, source degeneration inductor 432, and adjustable capacitor 428, which are coupled as described above for amplifier circuit 420 in FIG. 4. Amplifier circuit 422 further includes a second main cascode transistor 438 having its source coupled to the drain of gain transistor 434, its gate receiving a Vb2 control signal, and its drain coupled to a load circuit 490. Gain transistor 434 and cascode transistors 436 and 438 may be implemented with NMOS transistors, as shown in FIG. 6A, or with transistors of other types. In an exemplary design, cascode transistor 436 and load circuit 480 may be used for a first band group (e.g., low-band). Cascode transistor 438 and load circuit 490 may be used for a second band group (e.g., mid-band or high-band).

LNA 402 may operate in the first or second band group at any given moment. Gain transistor 434 may amplify the RFin signal and provide an amplified signal. Either cascode transistor 436 or 438 may be enabled to buffer the amplified signal and provide one output RF signal for one band group to one load circuit 480 or 490.

To operate in the first band group (e.g., low-band), main cascode transistor 436 may be enabled by applying a high voltage (e.g., Vdd) at its gate, and main cascode transistor 438 may be disabled by applying a low voltage (e.g., 0 volts (V)) at its gate. Main cascode transistor 436 may provide the RFout1 signal for the first band group to load circuit 480. Feedback circuit 450 may be enabled for operation in the first band group by applying a low voltage (e.g., 0V) at the gate of feedback cascode transistor 456. Feedback circuit 450 may then provide feedback to boost the source degeneration inductance. Source degeneration inductance boosting may be enabled in low-band when higher source degeneration inductance is desired in order to obtain similar input impedance at a lower frequency in low-band, since impedance is equal to frequency times inductance.

To operate in the second band group (e.g., mid-band or high-band), main cascode transistor 438 may be enabled, and main cascode transistor 436 may be disabled. Main cascode transistor 438 may provide the RFout2 signal for the second band group to load circuit 490. Feedback circuit 450 may be disabled for operation in the second band group by applying a high voltage (e.g., Vdd) at the gate of feedback cascode transistor 456. Feedback circuit 450 may then be disabled and would not provide feedback to change the source degeneration inductance. Source degeneration inductance boosting may be disabled in mid-band or high-band when higher source degeneration inductance is not needed.

In one exemplary design, feedback circuit 450 may be enabled for the first band group (e.g., low-band) and disabled for the second band group (e.g., mid-band or high-band), as described above. In another exemplary design, feedback circuit 450 may be enabled or disabled for each band group, e.g., depending on the desired source degeneration inductance.

Figure 6B:
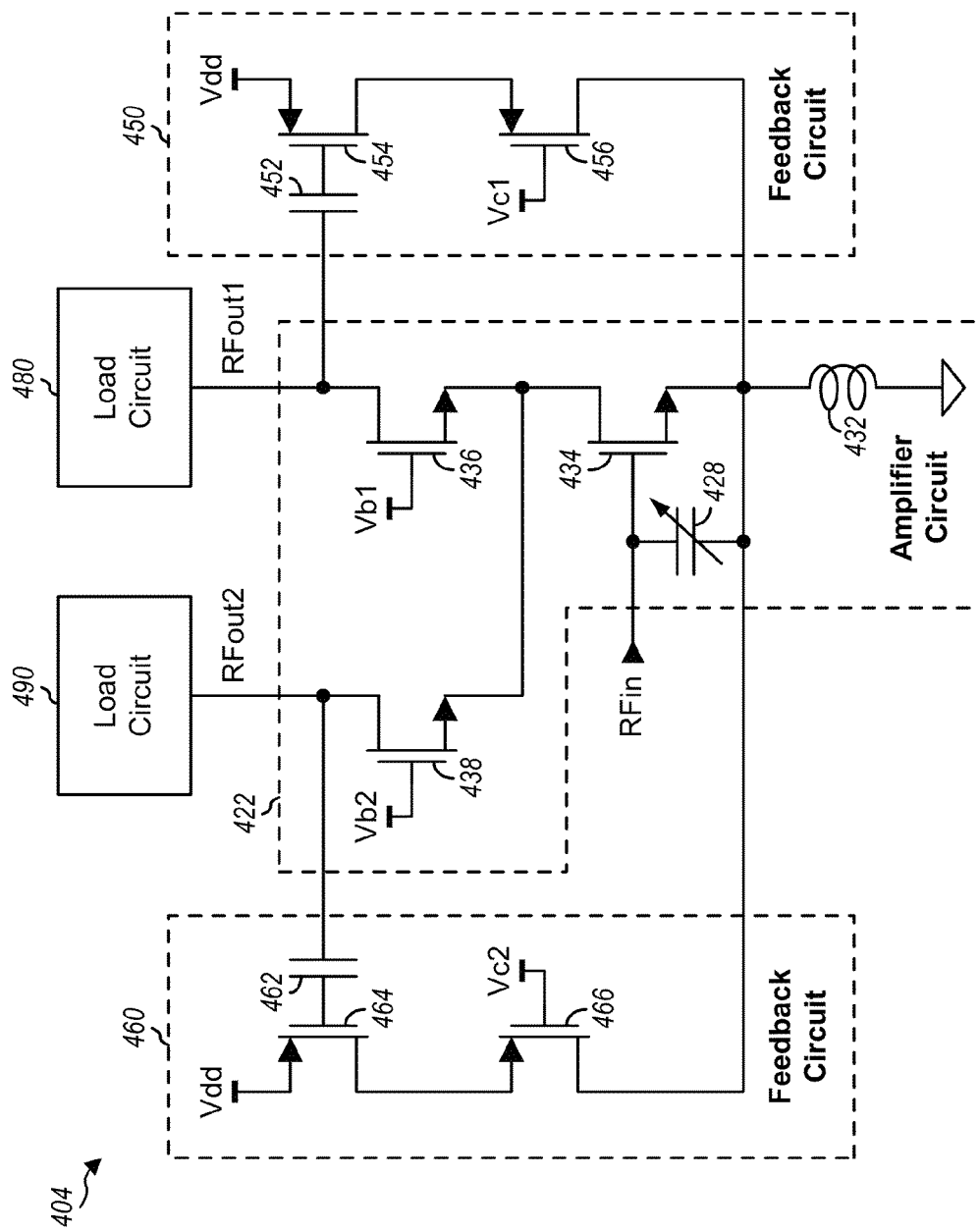

FIG. 6B shows a schematic diagram of an exemplary design of a SIMO LNA 404 with boosted source degeneration inductance. LNA 404 may also be used for any of LNAs 230 and 232 in FIG. 2. LNA 404 includes one LNA input receiving one input RF signal (RFin) and two LNA outputs providing up to two output RF signals (RFout1 and RFout2), which may be for two sets of carriers. LNA 404 includes amplifier circuit 422 and feedback circuits 450 and 460.

In the exemplary design shown in FIG. 6B, feedback circuit 460 includes an AC coupling capacitor 462, a gain transistor 464, and a cascode transistor 466. Capacitor 462 has one end coupled to the drain of cascode transistor 438 and the other end coupled to the gate of gain transistor 464. Gain transistor 464 has its source coupled to the Vdd supply voltage and its drain coupled to the source of cascode transistor 466. Cascode transistor 466 has its gate receiving a Vc2 control signal and its drain coupled to source degeneration inductor 432. Gain transistor 464 and cascode transistor 466 may be implemented with PMOS transistors, as shown in FIG. 6B, or with transistors of other types.

LNA 404 may operate in a single-output mode or a multi-output mode at any given moment. In the single-output mode, LNA 404 receives an input RF signal comprising at least one transmitted signal (e.g., on one set of carriers) and provides one output RF signal to one load circuit 480 or 490. In the multi-output mode, LNA 404 receives an input RF signal comprising at least two transmitted signals (e.g., on two sets of carriers) and provides two output RF signals (e.g., one output RF signal for each set of carriers) to two load circuits 480 and 490.

In the single-output mode, either (i) cascode transistor 436 may be enabled to provide the RFout1 signal to load circuit 480 or (ii) cascode transistor 438 may be enabled to provide the RFout2 signal to load circuit 490. If cascode transistor 436 is enabled, then feedback circuit 450 may be enabled to provide boosting of source degeneration inductance. If cascode transistor 438 is enabled, then feedback circuit 460 may be enabled to provide boosting of source degeneration inductance.

In the multi-output mode, both cascode transistors 436 and 438 may be enabled to provide the RFout1 and RFout2 signals to load circuits 480 and 490. In one exemplary design, either feedback circuit 450 or 460 may be enabled to provide boosting of source degeneration inductance. In another exemplary design, both feedback circuits 450 and 460 may be enabled to provide more boosting of source degeneration inductance. In yet another exemplary design, feedback circuits 450 and 460 may be disabled in the multi-output mode and enabled in the single-output mode when higher source degeneration inductance is desired. In general, each feedback circuit may be enabled or disabled depending on the desired boost of source degeneration inductance.

Figure 7:
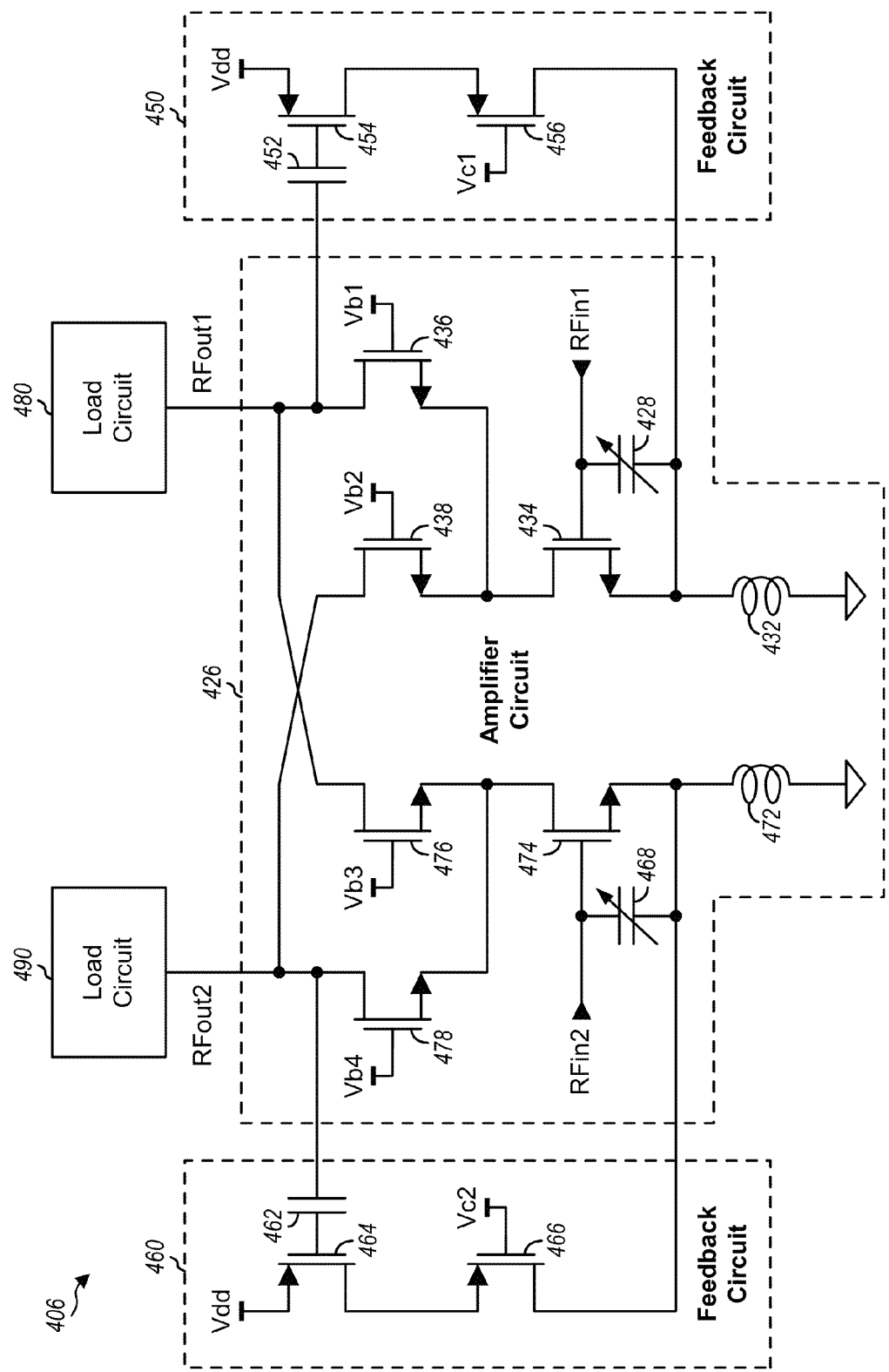
FIG. 7 shows a multiple-input multiple-output (MIMO) LNA with boosted source degeneration inductance.

FIG. 7 shows a schematic diagram of an exemplary design of a MIMO LNA 406 with boosted source degeneration inductance. LNA 406 may also be used for any of LNAs 230 and 232 in FIG. 2. LNA 406 includes two LNA inputs receiving up to two input RF signals (RFin1 and RFin2) and two LNA outputs providing up to two output RF signals (RFout1 and RFout2). The two LNA inputs may be for two bands or two band groups. The two LNA outputs may be for two sets of carriers. LNA 406 includes an amplifier circuit 426 and feedback circuits 450 and 460.

In the exemplary design shown in FIG. 7, amplifier circuit 426 includes gain transistor 434, cascode transistors 436 and 438, source degeneration inductor 432, and adjustable capacitor 428, which are coupled as described above for amplifier circuit 422 in FIG. 6A. Gain transistor 434 receives a first input RF signal (RFin1) at its gate. Cascode transistors 436 and 438 receive Vb1 and Vb2 control signals at their gates. Amplifier circuit 426 further includes a gain transistor 474, cascode transistors 476 and 478, a source degeneration inductor 472, and an adjustable capacitor 468. Gain transistor 474 has its source coupled to one end of inductor 472, its gate receiving a second input RF signal (RFin2), and its drain coupled to the sources of cascode transistors 476 and 478. The other end of inductor 472 is coupled to circuit ground. Cascode transistor 476 has its gate receiving a third control signal (Vb3) and its drain coupled to load circuit 480. Cascode transistor 478 has its gate receiving a fourth control signal (Vb4) and its drain coupled to load circuit 490. Capacitor 468 is coupled between the gate and source of gain transistor 474. Gain transistors 434 and 474 and cascode transistors 436, 438, 476 and 478 may be implemented with NMOS transistors, as shown in FIG. 7, or with transistors of other types.

LNA 406 may operate in a single-output mode or a multi-output mode at any given moment. In the single-output mode, LNA 406 receives the RFin1 or RFin2 signal comprising at least one transmitted signal (e.g., on one set of carriers) and provides one output RF signal to one load circuit 480 or 490. In the multi-output mode, LNA 406 receives the RFin1 and/or RFin2 signal comprising at least two transmitted signals (e.g., on two sets of carriers) and provides two output RF signals (e.g., one output RF signal for each set of carriers) to two load circuits 480 and 490.

In the single-output mode, either (i) gain transistor 434 may be enabled to amplify the RFin1 signal or (ii) gain transistor 474 may be enabled to amplify the RFin2 signal. If gain transistor 434 is enabled, then either (i) cascode transistor 436 may be enabled to provide the RFout1 signal or (ii) cascode transistor 438 may be enabled to provide the RFout2 signal. Conversely, if gain transistor 474 is enabled, then either (i) cascode transistor 476 may be enabled to provide the RFout1 signal or (ii) cascode transistor 478 may be enabled to provide the RFout2 signal. If cascode transistor 436 or 476 is enabled, then feedback circuit 450 may be enabled to provide boosting of source degeneration inductance. If cascode transistor 438 or 478 is enabled, then feedback circuit 460 may be enabled to provide boosting of source degeneration inductance.

In the multi-output mode, the RFin1 and/or RFin2 signal may be amplified to generate the RFout1 and RFout2 signals. If only the RFin1 signal is received, then gain transistor 434 and cascode transistors 436 and 438 may be enabled to amplify the RFin1 signal and generate the RFout1 and RFout2 signals. If only the RFin2 signal is received, then gain transistor 474 and cascode transistors 476 and 478 may be enabled to amplify the RFin2 signal and generate the RFout1 and RFout2 signals. If both the RFin1 and RFin2 signals are received, then gain transistors 434 and 474 may be enabled to amplify the two RFin signals and either cascode transistors 436 and 478 or cascode transistors 438 and 476 may be enabled to generate the RFout1 and RFout2 signals. Feedback circuit 450 may be enabled to boost of the inductance of source degeneration inductor 432. Alternatively or additionally, feedback circuit 460 may be enabled to boost of the inductance of source degeneration inductor 472. In another exemplary design, feedback circuits 450 and 460 may be disabled in the multi-output mode and enabled in the single-output mode.

FIG. 7 shows an exemplary design in which feedback circuit 450 is coupled between cascode transistor 436 and source degeneration inductor 432. In another exemplary design, feedback circuit 450 (or another feedback circuit) may be coupled between cascode transistor 438 and source degeneration inductor 432. Similarly, feedback circuit 460 (or another feedback circuit) may be coupled between cascode transistor 476 and source degeneration inductor 472.

The techniques for boosting or deboosting source degeneration inductance disclosed herein may provide various advantages. First, the techniques may be used to reduce the size of a source degeneration inductor of an amplifier such as an LNA. For example, a first LNA may have a source degeneration inductor of 1.2 nano Henries (nH) to provide the desired performance in terms of gain, input matching, linearity, and noise figure. Comparable performance may be obtained with a second LNA having a source degeneration inductor of 0.7 nH and negative feedback for boosting of the source degeneration inductance. Source degeneration inductance boosting may thus enable a smaller inductor of 0.7 nH to be used in place of a larger inductor of 1.2 nH. A smaller inductor may reduce circuit area and may be highly desirable to reduce size, cost, etc.

Second, the techniques may enable an LNA to support operation over a wider frequency range. The inductance value of a source degeneration inductor of the LNA may be related to the operating frequency of the LNA. Boosting or deboosting of the source degeneration inductance may be controlled by (i) enabling or disabling a feedback circuit and/or (ii) adjusting the gain of the feedback circuit. Adjustable source degeneration inductance may enable the LNA to operate over a wider frequency range. For example, the feedback circuit may be enabled for low-band and disabled for mid-band or high-band, as shown in FIG. 6A.

Third, the techniques may provide good performance for SIMO LNAs and MIMO LNAs. An LNA (e.g., a SIMO LNA or a MIMO LNA) may have an input impedance that changes between the single-output mode and the multi-output mode. The gain and input matching of the LNA may vary between the single-output mode and the multi-output mode due to changes in the LNA input impedance. Cgs capacitors 428 and 468 may help to adjust the imaginary part of the LNA input impedance. However, the real part of the LNA input impedance may be determined by source degeneration inductors 432 and 472 and may not be easily adjusted. The real part of the LNA input impedance may be varied via feedback from an LNA output to a source degeneration inductor, which may effectively change the source degeneration inductance. The changed source degeneration inductance may significantly reduce variations in the gain and input matching of the LNA between the single-output mode and the multi-output mode. A larger source degeneration inductor may be desirable in the single-output mode in order to improve input matching whereas a smaller source degeneration inductor may be desirable in the multi-output mode in order to improve noise figure and gain. The techniques may be used to change (e.g., boost) the source degeneration inductance in the single-output mode in order to improve input matching.

In an exemplary design, an apparatus (e.g., a wireless device, an IC, a circuit module, etc.) may include an amplifier circuit and a feedback circuit. The amplifier circuit (e.g., amplifier circuit 420 in FIG. 4) may receive an input signal and provide an output signal. The amplifier circuit may comprise a source degeneration inductor (e.g., source degeneration inductor 432). The feedback circuit (e.g., feedback circuit 450) may be coupled between a node of the amplifier circuit and the source degeneration inductor. The feedback circuit may provide feedback (e.g., negative feedback or positive feedback) to vary an input impedance of an amplifier comprising the amplifier circuit and the feedback circuit.

In an exemplary design, the amplifier circuit may comprise a gain transistor and a cascode transistor. The gain transistor (e.g., gain transistor 434 in FIG. 4) may be coupled to the source degeneration inductor and may receive and amplify the input signal. The cascode transistor (e.g., cascode transistor 436) may be coupled to the gain transistor and may provide the output signal. In an exemplary design, the amplifier circuit may further comprise a second cascode transistor, e.g., for a SIMO LNA shown in FIG. 6A or 6B. The second cascode transistor (e.g., cascode transistor 438 in FIG. 6A) may be coupled to the gain transistor and may provide a second output signal.

In another exemplary design, the amplifier circuit may further comprise a second gain transistor and third and fourth cascode transistors, e.g., for a MIMO LNA shown in FIG. 7. The second gain transistor (e.g., gain transistor 474 in FIG. 7) may be coupled to a second source degeneration inductor (e.g., inductor 472) and may receive and amplify a second input signal. The third cascode transistor (e.g., cascode transistor 476) may be coupled to the second gain transistor and the cascode transistor. The fourth cascode transistor (e.g., cascode transistor 478) may be coupled to the second gain transistor and the second cascode transistor.

In an exemplary design, the feedback circuit may comprise a feedback gain transistor and a feedback cascode transistor. The feedback gain transistor (e.g., gain transistor 454 in FIG. 4) may be coupled to the cascode transistor in the amplifier circuit and may receive and amplify the output signal. The feedback cascode transistor (e.g., cascode transistor 456) may be coupled between the feedback gain transistor and the source degeneration inductor.

In an exemplary design, the apparatus may further comprise a second feedback circuit (e.g., feedback circuit 460 in FIG. 6B or 7). The second feedback circuit may be coupled between a second node of the amplifier circuit and the source degeneration inductor, e.g., as shown in FIG. 6B. Alternatively, the second feedback circuit may be coupled between the second node of the amplifier circuit and a second source degeneration inductor, e.g., as shown in FIG. 7.

In an exemplary design, the amplifier circuit may further comprise an adjustable capacitor (e.g., capacitor 428 in FIG. 4), which may be coupled between a gate and a source of the gain transistor in the amplifier circuit. The adjustable capacitor may be adjusted to obtain good input matching for the amplifier.

In an exemplary design, the gain transistor and the cascode transistor in the amplifier circuit may comprise NMOS transistors, e.g., as shown in FIG. 4. The gain transistor and the cascode transistor in the feedback circuit may comprise PMOS transistors, e.g., as shown in FIG. 4. The transistors in the amplifier circuit and the feedback circuit may also comprise transistors of other types.

In an exemplary design, the amplifier circuit may provide the output signal for a first band group or the second output signal for a second band group, e.g., as shown in FIG. 6A. The feedback circuit may be (i) enabled when the amplifier circuit provides the output signal for the first band group (e.g., low-band) or (ii) disabled when the amplifier circuit provides the second output signal for the second band group (e.g., mid-band or high-band).

In another exemplary design, the amplifier circuit may provide (i) either the output signal or the second output signal in a single-output mode or (ii) both the output signal and the second output signal in a multi-output mode, e.g., as shown in FIG. 6B. The amplifier circuit may provide (i) one output signal for one set of carriers in the single-output mode or (ii) two output signals for two sets of carriers in the multi-output mode. The feedback circuit may be enabled in the single-output mode and disabled in the multi-output mode.

In an exemplary design, the feedback circuit may be programmable to provide feedback or no feedback. For example, the feedback circuit may be enabled to provide feedback or disabled to provide no feedback. In another exemplary design, the feedback circuit may always be enabled to provide feedback. This exemplary design may enable a smaller source degeneration inductor to be used for the amplifier. For both exemplary designs, the feedback circuit may have a variable gain to provide a variable input impedance for the amplifier.

Figure 8:
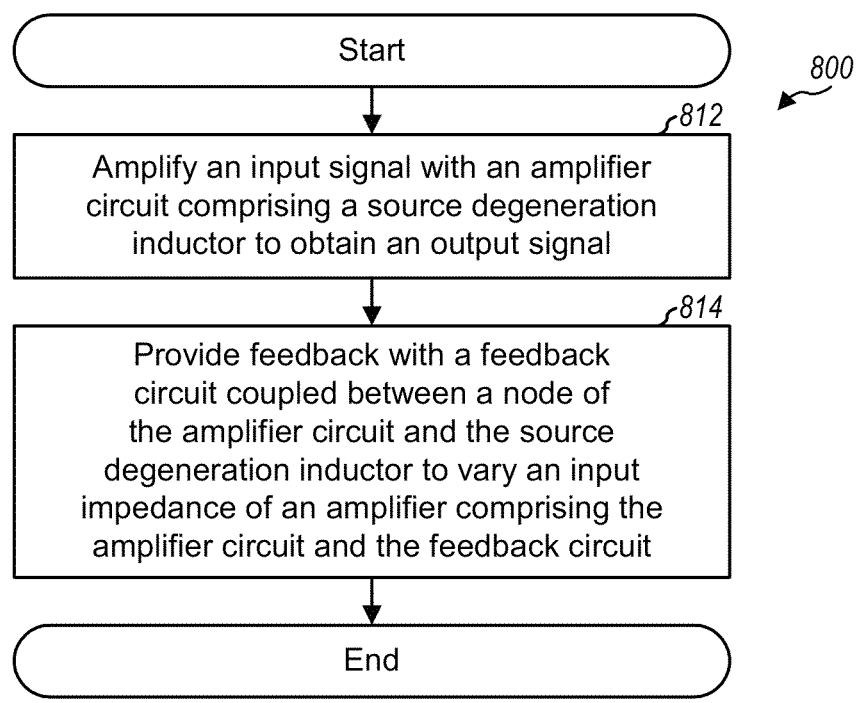
FIG. 8 shows a process for performing signal amplification.

FIG. 8 shows an exemplary design of a process 800 for performing signal amplification. An input signal may be amplified with an amplifier circuit comprising a source degeneration inductor to obtain an output signal (block 812). Feedback (e.g., negative feedback or positive feedback) may be provided with a feedback circuit coupled between a node of the amplifier circuit and the source degeneration inductor to vary an input impedance of an amplifier comprising the amplifier circuit and the feedback circuit (block 814).

In an exemplary design, the amplifier may be a multi-band amplifier supporting operation on first and second band groups. The amplifier may provide the output signal for the first band group (e.g., low-band) or a second output signal for the second band group (e.g., mid-band or high-band). The feedback circuit may be (i) enabled when the amplifier provides the output signal for the first band group or (ii) disabled when the amplifier provides the second output signal for the second band group.

In another exemplary design, the amplifier may support carrier aggregation. The amplifier may provide (i) either the output signal or a second output signal in a single-output mode or (ii) both the output signal and the second output signal in a multi-output mode. The feedback circuit may be enabled in the single-output mode or disabled in the multi-output mode.

The amplifiers with boosted or deboosted source degeneration inductance disclosed herein may be implemented on an IC, an analog IC, an RFIC, a mixed-signal IC, an ASIC, a printed circuit board (PCB), an electronic device, etc. The amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an amplifier with boosted or deboosted source degeneration inductance may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    an amplifier circuit configurable to receive an input signal and provide an output signal for a first band group or a second output signal for a second band group, the amplifier circuit comprising a source degeneration inductor; and
    a feedback circuit coupled between a node of the amplifier circuit and the source degeneration inductor, the feedback circuit configured to provide feedback to vary an input impedance of an amplifier comprising the amplifier circuit and the feedback circuit, the feedback circuit being enabled when the amplifier circuit provides the output signal for the first band group and disabled when the amplifier circuit provides the second output signal for the second band group.

2. The apparatus of claim 1, the amplifier circuit comprising:
    a gain transistor coupled to the source degeneration inductor and configurable to receive and amplify the input signal; and
    a cascode transistor coupled to the gain transistor and configurable to provide the output signal.

3. The apparatus of claim 2, the amplifier circuit further comprising:
    a second cascode transistor coupled to the gain transistor and configurable to provide a second output signal.

4. The apparatus of claim 3, the amplifier circuit further comprising:
    a second gain transistor coupled to a second source degeneration inductor and configurable to receive and amplify a second input signal;
    a third cascode transistor coupled to the second gain transistor and the cascode transistor; and
    a fourth cascode transistor coupled to the second gain transistor and the second cascode transistor.

5. The apparatus of claim 2, the feedback circuit comprising:
    a second gain transistor coupled to the cascode transistor and configurable to receive and amplify the output signal; and
    a second cascode transistor coupled between the second gain transistor and the source degeneration inductor.

6. The apparatus of claim 1, further comprising:
    a second feedback circuit coupled between a second node of the amplifier circuit and the source degeneration inductor or a second source degeneration inductor within the amplifier circuit.

7. The apparatus of claim 2, the amplifier circuit further comprising:
    an adjustable capacitor coupled between a gate and a source of the gain transistor.

8. The apparatus of claim 5, the gain transistor and the cascode transistor comprising N-channel metal oxide semiconductor (NMOS) transistors, and the second gain transistor and the second cascode transistor comprising P-channel metal oxide semiconductor (PMOS) transistors.

9. The apparatus of claim 1, the amplifier circuit configurable to provide either the output signal or a second output signal in a single-output mode and to provide both the output signal and the second output signal in a multi-output mode.

10. The apparatus of claim 9, the feedback circuit being enabled in the single-output mode and disabled in the multi-output mode.

11. The apparatus of claim 1, the feedback circuit being programmable to provide feedback or no feedback.

12. The apparatus of claim 1, the feedback circuit being always enabled to provide feedback.

13. The apparatus of claim 1, the feedback circuit having a variable gain to provide a variable input impedance for the amplifier.

14. A method comprising:
    amplifying an input signal with an amplifier circuit comprising a source degeneration inductor to obtain an output signal for a first band group or a second output signal for a second band group;
    providing feedback with a feedback circuit coupled between a node of the amplifier circuit and the source degeneration inductor to vary an input impedance of an amplifier comprising the amplifier circuit and the feedback circuit;
    enabling the feedback circuit when the output signal for the first band group is provided; and
    disabling the feedback circuit when the second output signal for the second band group is provided.

15. The method of claim 14, further comprising:
    providing either the output signal or a second output signal in a single-output mode;
    providing both the output signal and the second output signal in a multi-output mode;
    enabling the feedback circuit in the single-output mode; and
    disabling the feedback circuit in the multi-output mode.

16. An apparatus comprising:
    means for amplifying an input signal to obtain an output signal for a first band group or a second output signal for a second band group, the means for amplifying comprising means for degenerating; and
    means for providing feedback coupled between a node of the means for amplifying and the means for degenerating, the means for providing feedback configured to vary an input impedance of an amplifier means comprising the means for amplifying and the means for providing feedback, the means for providing feedback being enabled when the means for amplifying provides the output signal for the first band group and being disabled when the means for amplifying provides the second output signal for the second band group.

17. The apparatus of claim 16, the means for amplifying configured to provide either the output signal or a second output signal in a single-output mode and to provide both the output signal and the second output signal in a multi-output mode, and the means for providing feedback being enabled in the single-output mode and disabled in the multi-output mode.

* * * * *